(12) United States Patent
Bechmann et al.

(10) Patent No.: US 10,836,109 B2
(45) Date of Patent: Nov. 17, 2020

(54) APPARATUS FOR ADDITIVELY MANUFACTURING THREE-DIMENSIONAL OBJECTS

(71) Applicant: CONCEPT LASER GMBH, Lichtenfels (DE)

(72) Inventors: Florian Bechmann, Lichtenfels (DE); Tobias Bokkes, Untersiemau (DE); Philipp Schumann, Itzgrund-Schottenstein (DE); Alexandra Popp, Bad Staffelstein (DE); Marie-Christin Ebert, Coburg (DE)

(73) Assignee: Concept Laser GmbH, Lichtenfels (DE)

( * ) Notice: Subject to any disclaimer, the term of this patent is extended or adjusted under 35 U.S.C. 154(b) by 0 days.

(21) Appl. No.: 16/056,162

(22) Filed: Aug. 6, 2018

(65) Prior Publication Data

US 2019/0039319 A1 Feb. 7, 2019

(30) Foreign Application Priority Data

Aug. 7, 2017 (EP) .................................... 17185195

(51) Int. Cl.
*B29C 64/393* (2017.01)
*B33Y 50/02* (2015.01)
(Continued)

(52) U.S. Cl.
CPC .......... *B29C 64/393* (2017.08); *B22F 3/1055* (2013.01); *B29C 64/153* (2017.08);
(Continued)

(58) Field of Classification Search
CPC ... B29C 64/393; B29C 64/165; B29C 64/153; B22F 3/1055; B22F 2003/1057;
(Continued)

(56) References Cited

U.S. PATENT DOCUMENTS

| 7,718,933 B2 | 5/2010 | Huskamp |
| 9,592,636 B2 | 3/2017 | Araie et al. |

(Continued)

FOREIGN PATENT DOCUMENTS

| JP | 5721887 B1 | 5/2015 |
| WO | 2016081651 A1 | 5/2016 |

(Continued)

OTHER PUBLICATIONS

Chinese Search Report and Office Action Corresponding to Application No. 201711006311 dated Jun. 2, 2020.

(Continued)

*Primary Examiner* — Christopher E. Everett
(74) *Attorney, Agent, or Firm* — Dority & Manning, P.A.

(57) ABSTRACT

Apparatus (1) for additively manufacturing three-dimensional objects (2) by successive layerwise selective irradiation and consolidation of layers of a build material (3) which can be consolidated by means of an energy beam (4), the apparatus comprising: a first detection device (15) adapted to detect at least one first process parameter (P1), particularly during operation of the apparatus (1), and to generate a first data set (DS1) comprising information relating to the detected first process parameter (P1); at least one second detection device (16) adapted to detect at least one second process parameter (P2), particularly during operation of the apparatus (1), and to generate at least one second data set (DS2) comprising information relating to the detected second process parameter (P2); a data processing device (18) adapted to link the first data set (DS1) with the at least one second data set (DS1).

18 Claims, 1 Drawing Sheet

(51) Int. Cl.
*B29C 64/153* (2017.01)
*B29C 64/165* (2017.01)
*B33Y 40/00* (2020.01)
*B22F 3/105* (2006.01)
*G06F 30/00* (2020.01)
*B33Y 10/00* (2015.01)
*B33Y 30/00* (2015.01)

(52) U.S. Cl.
CPC .......... *B29C 64/165* (2017.08); *B33Y 40/00* (2014.12); *B33Y 50/02* (2014.12); *G06F 30/00* (2020.01); *B22F 2003/1057* (2013.01); *B33Y 10/00* (2014.12); *B33Y 30/00* (2014.12)

(58) Field of Classification Search
CPC ......... B33Y 40/00; B33Y 50/02; B33Y 30/00; B33Y 10/00; G06F 17/50
See application file for complete search history.

(56) References Cited

U.S. PATENT DOCUMENTS

| | | |
|---|---|---|
| 2008/0257879 A1 | 10/2008 | Huskamp |
| 2015/0261196 A1* | 9/2015 | Wilson .................. B33Y 10/00 700/119 |
| 2016/0098825 A1 | 4/2016 | Dave et al. |
| 2016/0184893 A1* | 6/2016 | Dave ...................... B33Y 10/00 419/53 |
| 2016/0185048 A1* | 6/2016 | Dave ...................... B33Y 50/02 700/119 |
| 2017/0090462 A1* | 3/2017 | Dave ...................... G01N 21/00 |
| 2017/0106595 A1 | 4/2017 | Günther et al. |
| 2017/0266762 A1* | 9/2017 | Dave ........................ G01J 5/04 |
| 2017/0266880 A1 | 9/2017 | Matsubara |
| 2018/0236550 A1 | 8/2018 | Herzog |
| 2018/0370144 A1 | 12/2018 | Revanur et al. |

FOREIGN PATENT DOCUMENTS

| | | |
|---|---|---|
| WO | 2017085468 A1 | 5/2017 |
| WO | WO2017/085469 A1 | 5/2017 |
| WO | WO2017085469 A1 | 5/2017 |
| WO | WO2017/102384 A1 | 6/2017 |
| WO | WO2017102384 A | 6/2017 |

OTHER PUBLICATIONS

European Search Report Corresponding to Application No. 17185195 dated Feb. 6, 2018.
Machine Translated Japanese Office Action Corresponding to Application No. 2018018855 dated Apr. 12, 2019.
Machine Translated Japanese Office Action Corresponding to Application No. 2018018855 dated Aug. 20, 2019.

* cited by examiner

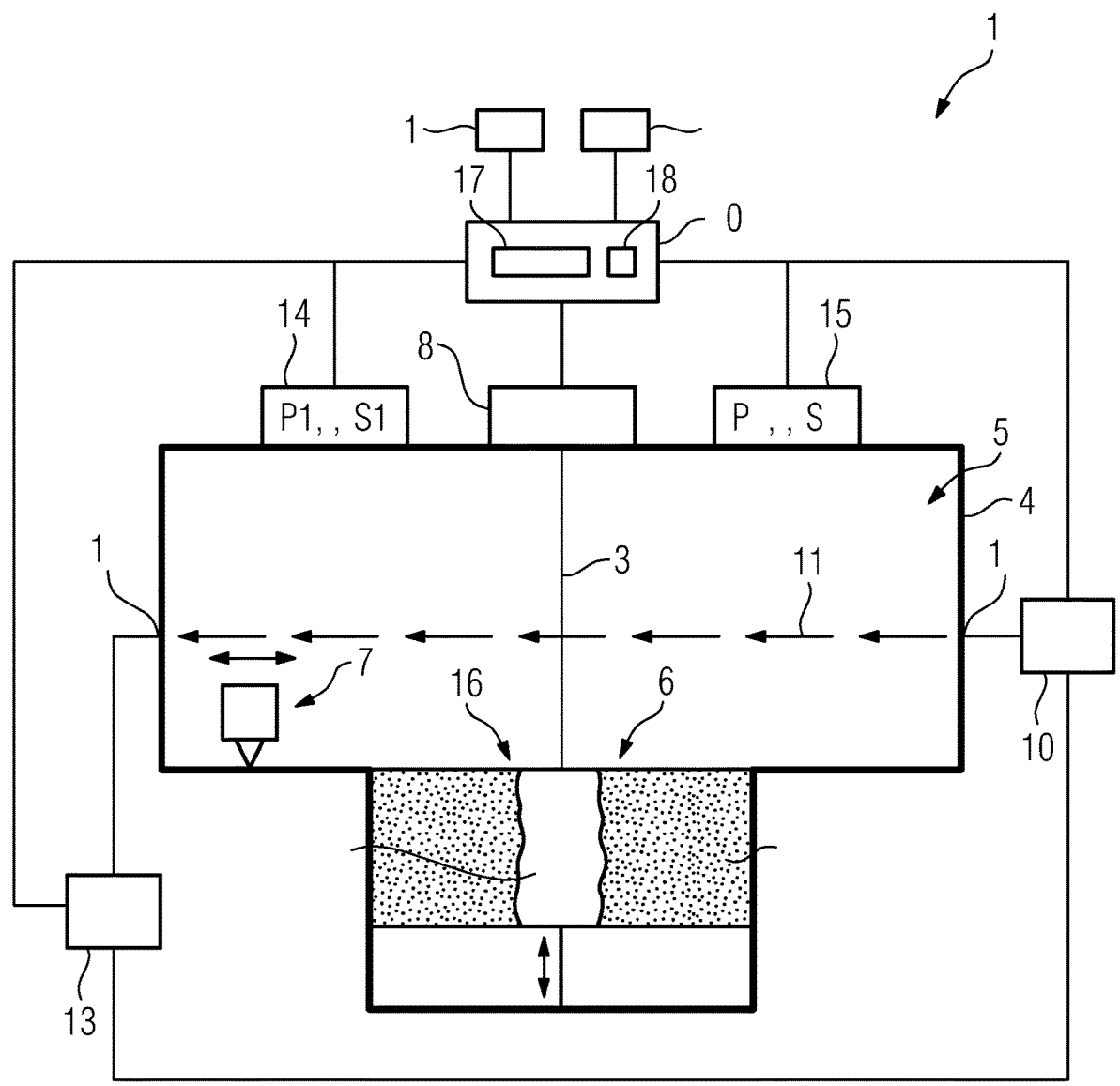

APPARATUS FOR ADDITIVELY MANUFACTURING THREE-DIMENSIONAL OBJECTS

CROSS-REFERENCE TO RELATED APPLICATIONS

This application claims priority to European Patent Application serial no. 17 185 195.9 filed Aug. 7, 2017, the contents of which is incorporated herein by reference in its entirety as if set forth verbatim.

The invention relates to an apparatus for additively manufacturing three-dimensional objects by means of successive layerwise selective irradiation and consolidation of layers of a build material which can be consolidated by means of an energy beam, the apparatus comprising a first detection device adapted to detect at least one first process parameter, particularly during operation of the apparatus, and to generate a first data set comprising information relating to the detected first process parameter; and at least one further detection device adapted to detect at least one second process parameter, particularly during operation of the apparatus, and to generate at least one second data set comprising information relating to the detected second process parameter.

Respective apparatuses for additively manufacturing three-dimensional objects are widely known and may be embodied as selective laser melting apparatuses or selective electron beam melting apparatuses, for instance.

It is also known that respective apparatuses comprise diverse detection devices adapted to detect diverse process parameters during operation of the apparatus. The detection devices are adapted to generate data sets comprising/containing information relating to the respective detected process parameter. Respective data sets may be used in a quality monitoring process implemented for monitoring of the additive build process, in particular the process quality, during operation of the apparatus.

Hitherto, respective data sets are observed separately, i.e. in isolated manner. Yet, the information given in a (single) respective data set may not be sufficient to allow for a complete comprehensive monitoring of the additive build process, in particular the process quality, during operation of the apparatus.

In view of the above, it is the object of the invention provide an apparatus for additively manufacturing of three-dimensional objects allowing for an improved monitoring of the additive build process, in particular the process quality, during operation of the apparatus.

This object is achieved by an apparatus for additively manufacturing three-dimensional objects according to independent claim 1. The dependent claims relate to possible embodiments of the apparatus according to independent claim 1.

The apparatus described herein is an apparatus for additively manufacturing three-dimensional objects, e.g. technical components, by means of successive layerwise selective irradiation and consolidation of layers of a typically powdered build material ("build material") which can be consolidated by means of an energy beam. A respective build material can be a metal, ceramic or polymer powder, for instance. A respective build material can comprise a material mixture comprising (chemically) different materials. A respective energy beam can be a laser beam or an electronic beam, for instance. A respective apparatus can be a selective laser melting apparatus or a selective electron beam melting apparatus, for instance.

The apparatus comprises a number of structural and/or functional devices which are used during its operation. Exemplary structural and/or functional devices are:

a process chamber comprising a process volume and a build plane, i.e. the plane in which the additive build-up of a three-dimensional object to be additively manufactured takes place by selectively irradiating and consolidating build material layers, of the apparatus;

a build material application device, the build material application device being adapted to apply a (defined) layer of build material which is to be selectively irradiated and consolidated in the build plane of the apparatus;

an irradiation device, which may comprise a beam generation device and/or a beam deflection or scanning device, the irradiation device being adapted to selectively irradiate a build material layer disposed in the process chamber with at least one energy beam;

a stream generation device, the stream generation device being adapted to generate a typically inert gaseous fluid stream at least partly streaming through the process chamber with given streaming properties, e.g. a given streaming profile, streaming velocity, etc., which is capable of being charged with non- or partially consolidated build material, particularly smoke or smoke residues generated during operation of the apparatus, while streaming through the process chamber;

a filtering device, the filtering device being adapted to filter a gaseous fluid stream charged with build material, i.e. adapted to remove build material from a gaseous fluid stream by filtering.

The apparatus further comprises a plurality of, i.e. at least two, hard- and/or software embodied detection devices which are each adapted to detect at least one process parameter, particularly detectable during operation of the apparatus. Respective detection devices are each adapted to generate a data set comprising the respective detected process parameter or information relating to the respective detected process parameter, respectively. Exemplary embodiments of respective detection devices are given further below.

As such, the apparatus may comprise a first detection device adapted to detect at least one first process parameter, particularly during operation of the apparatus, and to generate a first data set comprising the first process parameter or information relating to the detected first process parameter, respectively; and at least one second detection device adapted to detect at least one second process parameter, particularly during operation of the apparatus, and to generate at least one second data set comprising the second process parameter or information relating to the detected second process parameter, respectively. The first process parameter detectable or detected by the first detection device is typically a different process parameter as the second process parameter detectable or detected by the second detection device. In other words, the first process parameter typically relates to a different quantity as the second process parameter.

The apparatus further comprises a hard- and/or software embodied data processing device, e.g. a computing device, adapted to link the first data set with the at least one second data set so as to allow for a determination of correlations, in particular dependencies, between a detected first process parameter and a detected second process parameter. The data processing device therefore, is adapted for a special data processing which allows for a linkage of respective data sets generated by different detection devices of the apparatus. Hence, a first process parameter or a plurality of first process parameters contained in a first data set can be linked with a second process parameter or a plurality of second process parameters contained in a second data set.

The data linkage of respective data sets creates the possibility of determining discovering, recognizing or observing correlations, in particular dependencies, between different process parameters and therefore, a special way of analyzing and evaluating, respectively respective process parameters and data sets generated by different detection devices of the apparatus. This allows for a determination, discovery, recognition and observation of correlations, between detected first process parameters and detected second process parameters. In particular, a possible or real influence of a first process parameter on a second process parameter and a possible or real influence of a change of a first process parameter on a possible or real change of a second process parameter may be determined.

As is apparent from the below description of examples of first and second process parameters, an exemplary first process parameter may be or refer to at least one chemical parameter and/or physical parameter of the atmosphere within the process chamber of the apparatus. As such, the first process parameter may relate to the concentration of a certain gas fraction, e.g. the fraction of oxygen, of the chemical composition of the atmosphere in the process chamber. A second process parameter may be or refer to at least one chemical parameter and/or geometrical parameter and/or physical parameter of at least one consolidation zone, particularly a melting zone in which build material is heated above its melting point by means of irradiation and consolidated by subsequent cooling below its melting point, in which the selective irradiation and consolidation of layers of build material takes place during operation of the apparatus. Hence, the data linkage of respective data sets and first and second process parameters allows for determining, discovering, recognizing or observing correlations, in particular dependencies, between chemical and/or physical parameters of the atmosphere in the process chamber (as an example of a first process parameter) and a chemical parameter and/or geometrical parameter and/or physical parameter of at least one consolidation zone (as an example of a second process parameter).

This applies to all other first and second process parameters, particularly the first and second process parameters mentioned below. Thus, it is also possible to determine correlations between a chemical parameter and/or physical parameter of a gaseous fluid stream streaming through the process chamber of the apparatus as a further example of a first process parameter and a chemical parameter and/or geometrical parameter and/or physical parameter of at least one consolidation zone as an example of a second process parameter, for instance.

Knowledge or insights on respective correlations or dependencies, respectively of process parameters allows for an improved monitoring of the additive build process, in particular the process quality, during operation of the apparatus. Hence, the data linkage of respective data sets allows for a more comprehensive monitoring and understanding of the additive build process, in particular the process quality, during operation of the apparatus. A more comprehensive monitoring and understanding of the additive build process allows for an improved adjustment of process parameters resulting in improved process and part quality.

The apparatus may further comprise a hard- and/or software embodied data analyzation and/or evaluation device ("evaluation device") adapted to analyze and/or evaluate the linked first and second data sets so as to determine correlations, in particular dependencies, between a detected first process parameter and at least one detected second process parameter. The evaluation device is typically assigned to the data linkage device. The evaluation device may comprise a number of data analyzation and/or evaluation algorithms adapted to analyze and/or evaluate respective linked data sets so as to determine, discover, recognize or observe correlations, in particular dependencies, between detected first and second process parameters.

In the following, examples of first and second process parameter are given.

A first process parameter may be or may refer to at least one chemical parameter, e.g. chemical behavior, chemical composition, etc., and/or physical parameter, e.g. density, humidity, inertization, temperature, pressure, etc., of the atmosphere within a process chamber of the apparatus.

A first process parameter may additionally or alternatively may be or refer to at least one chemical parameter, e.g. chemical behavior, chemical composition, etc., and/or physical parameter, e.g. humidity, inertization, temperature, etc., of a structural and/or functional device of the apparatus, e.g. the process chamber of the apparatus or a powder module, e.g. a dose module, a build module, or an overflow module, adapted to receive an amount of non-irradiated or irradiated build material, attachable or attached to the process chamber of the apparatus. As a concrete example, a first process parameter may be the wall temperature of a wall portion of the process chamber or a respective powder module.

A first process parameter may additionally or alternatively may be or refer to at least one chemical parameter, e.g. chemical behavior, chemical composition, etc., and/or physical parameter, e.g. density, humidity, inertization, temperature, pressure, streaming profile, streaming velocity, etc., of a gaseous fluid stream streaming through the process chamber of the apparatus.

A first process parameter may additionally or alternatively may be or refer to at least one chemical parameter, e.g. chemical behavior, chemical composition, etc., and/or physical parameter, e.g. density, humidity, inertization, temperature, particle size (distribution), layer dimensions, layer thickness, etc., of non-irradiated or non-consolidated or irradiated or consolidated build material, in particular of non-consolidated or consolidated portions of a build material layer.

A first process parameter may additionally or alternatively may be or refer to at least one parameter, e.g. beam or focus diameter, beam or focus energy/intensity (distribution), beam or focus profile, beam or focus velocity, etc., of an energy beam for selectively irradiating a layer of build material.

A first process parameter may additionally or alternatively may be or refer to at least one operational parameter of a structural and/or functional device of the apparatus. As an example, a first process parameter may be or refer to an operational parameter, e.g. irradiation strategy, of an irradiation device, an operational parameter, e.g. build material application velocity, layer thickness, of a build material application device, an operational parameter, e.g. stream generation power, of a stream generation device, an operational parameter, e.g. inertization power, of an inertization device, an operational parameter, e.g. filter power, filter surface, etc., of a filtering device.

As is apparent from the aforementioned examples of first process parameters, the first detection device may be or comprise a detection element, in particular a sensor element, adapted to detect at least one chemical and/or physical parameter of the atmosphere within a process chamber of the apparatus; and/or at least one chemical and/or physical parameter of a structural and/or functional device of the apparatus; and/or at least one chemical and/or physical parameter of a gaseous fluid stream streaming through the process chamber of the apparatus; and/or at least one chemical and/or physical parameter of non-consolidated or consolidated build material, in particular of non-consolidated or consolidated portions of a build material layer; and/or at least one parameter of an energy beam for selectively irradiating a layer of build material; and/or at least one operational parameter of a structural and/or functional device of the apparatus. The concrete functional and/or constructive design of a respective detection element is chosen under consideration of the respective first process parameter(s) to be detected by the respective detection element and the first detection device, respectively. As an example, a respective detection element may be a chemical or physical detector or sensor adapted to detect at least one of the aforementioned examples of first process parameters.

The at least one second process parameter may be or refer to at least one chemical parameter, e.g. chemical composition, chemical behavior, etc., and/or geometrical parameter, e.g. dimensions, shape, etc., and/or physical parameter, e.g. temperature, radiation emission, etc., of at least one consolidation zone, particularly a melting zone in which build material is heated above its melting point by means of irradiation and consolidated by subsequent cooling below its melting point, in which the selective irradiation and consolidation of layers of build material takes place during operation of the apparatus. Hence, a second process parameter may (directly) refer to a consolidation zone in which an irradiation and consolidation of build material takes place during operation of the apparatus.

As is apparent from the aforementioned examples of second process parameters, the second detection device may be or comprise at least one detection element adapted to detect at least one chemical parameter and/or geometrical parameter and/or physical parameter of the consolidation zone, particularly melting zone in which build material is heated above its melting point and consolidated by subsequent cooling below its melting point. The concrete functional and/or constructive design of respective detection element is chosen under consideration of the respective second process parameter(s) to be detected by the respective detection element and the second detection device, respectively. As an example, a respective detection element may be an optical or thermal detector, in particular an optical or thermal sensor, e.g. a camera and/or a photodiode.

The apparatus may further comprise a (central) process control device adapted to control at least one process parameter on basis of a determined correlation, in particular dependency, between a detected first process parameter and a detected at least one second process parameter. Hence, determined correlations or dependencies of process parameters may be readily used for controlling process parameters and the entire build process so as to allow for improvements of process and object quality. In particular, determined correlations may be used in real-time for controlling process parameters and the entire build process so as to allow for real-time improvements of process and object quality during operation of the apparatus.

The apparatus may further comprise an information output device adapted to output a, particularly audio and/or video, information relating to a determined correlation, in particular dependency, between a detected first process parameter and a detected second process parameter. Hence, determined correlations or dependencies of detected first and second process parameter may be output to a user. The term output refers both to an audio and/or video output of respective information at a respective output interface, e.g. display, loudspeaker, etc., provided with the apparatus, and a data transmission of respective information via a wired or wireless, if need be encoded, data transmission to a data network and/or at least one (mobile) device of a user.

The or a respective information output device may be adapted to output a, particularly audio and/or video, warning information relating to a determined correlation or dependency between a detected first process parameter and a detected second process parameter which correlation or dependency may negatively affect the process quality and/or object quality. Hence, a user may be instantly informed about possible correlations of process parameters which might compromise process quality and/or object quality.

The apparatus may further comprise a data storage device, e.g. a hard-drive, adapted to store determined correlations or dependencies of detected first and second process parameters. Thus, determined correlations or dependencies of detected first and second process parameters can be stored and used for process monitoring in future additive manufacturing processes. The data storage device may be accessible by different apparatuses, e.g. in an additive manufacturing plant in which a plurality of apparatuses is installed.

The invention further relates to a method for operating at least one apparatus for additively manufacturing three-dimensional objects by means of successive layerwise selective irradiation and consolidation of layers of a build material which can be consolidated by means of an energy beam. The method may be implemented as selective laser melting process or a selective electron beam melting process, for instance. The method comprises the steps of:

detecting at least one first process parameter, particularly during operation of the apparatus, and generating a first data set comprising information relating to the detected first process parameter;

detecting at least one second process parameter, particularly during operation of the apparatus, and generating at least one second data set comprising information relating to the detected second process parameter;

linking the first data set with the at least one second data set so as to determine correlations, in particular dependencies, between the detected first process parameter and the detected second process parameter.

All annotations regarding the apparatus apply to the method in analogous manner.

An exemplary embodiment of the invention is described with reference to the FIGURE, whereby the sole FIGURE shows a principle drawing of an apparatus for additively manufacturing three-dimensional objects according to an exemplary embodiment.

The sole FIGURE shows a principle drawing of an apparatus 1 for additively manufacturing three-dimensional objects 2, e.g. technical components, by means of successive layerwise selective irradiation and accompanying consolidation of layers of a powdered build material 3, e.g. a metal powder, which can be consolidated by means of an energy beam 4, e.g. a laser beam or an electron beam. The apparatus 1 can be a selective laser melting apparatus or a selective electron beam melting apparatus, for instance.

The apparatus 1 comprises a number of structural and/or functional devices, exemplary examples of which are mentioned below:

A process chamber 5 comprising a process volume 6 and a build plane 7, i.e. the plane in which the additive build-up of a three-dimensional object 2 to be additively manufactured takes place by selectively irradiating and consolidating build material layers, of the apparatus 1.

A build material application device 8, the build material application device 8 being adapted to apply a (defined) layer of build material 3 which is to be selectively irradiated and consolidated in the build plane 7 of the apparatus 1. The build material application device 8 is or comprises a coating device being moveably supported relative to the build plane 7 in the embodiment of the FIGURE An irradiation device 9, which may comprise a beam generation device and/or a beam deflection or scanning device, the irradiation device 9 being adapted to selectively irradiate a build material layer disposed in the process chamber 5 with at least one energy beam 4.

A stream generation device 10, the stream generation device 10 being adapted to generate a typically inert gaseous fluid stream (indicated by arrows 11) at least partly streaming through the process chamber 5, i.e. between a process chamber inlet 12 and a process chamber outlet 13, with given streaming properties, e.g. a given streaming profile, streaming velocity, etc. The gaseous fluid stream is capable of being charged with non- or partially consolidated build material 3, particularly smoke or smoke residues generated during operation of the apparatus 1, while streaming through the process chamber 5.

A filtering device 14, the filtering device 14 being adapted to filter the gaseous fluid stream charged with build material 3, i.e. adapted to remove build material from the gaseous fluid stream by filtering.

As is discernible from the FIGURE the gaseous fluid stream may stream in a closed loop between the stream generation device 10, the process chamber 5 and the filtering device 14.

The apparatus 1 comprises a first detection device 15 adapted to detect at least one first process parameter P1, particularly during operation of the apparatus 1, and to generate a first data set DS1 comprising the first process parameter P1 or information relating to the detected first process parameter P1.

The first process parameter P1 may be or refer to at least one chemical and/or physical parameter of the atmosphere within the process chamber 5 of the apparatus 1; and/or at least one chemical and/or physical parameter of a structural and/or functional device of the apparatus 1; and/or at least one chemical and/or physical parameter of the gaseous fluid stream streaming through the process chamber 5 of the apparatus 1; and/or at least one chemical and/or physical parameter of non-consolidated or consolidated build material 3, in particular of non-consolidated or consolidated portions of a build material layer; and/or at least one parameter of the energy beam 4 for selectively irradiating a layer of build material; and/or at least one operational parameter of at least one functional device of the apparatus 1.

The first detection device 15 may be or comprise a detection element, in particular a sensor element, adapted to detect at least one chemical and/or physical parameter of the atmosphere within the process chamber 5 of the apparatus 1; and/or at least one chemical and/or physical parameter of a structural and/or functional device of the apparatus 1; and/or at least one chemical and/or physical parameter of the gaseous fluid stream streaming through the process chamber 5 of the apparatus 1; and/or at least one chemical and/or physical parameter of non-consolidated or consolidated build material 3, in particular of non-consolidated or consolidated portions of a build material layer; and/or at least one parameter of the energy beam 4 for selectively irradiating a layer of build material 3; and/or at least one operational parameter of a structural and/or functional device of the apparatus 1. A respective detection element may be a chemical or physical detector or sensor adapted to detect at least one of the aforementioned examples of first process parameters.

The apparatus 1 further comprises at least one second detection device 16 adapted to detect at least one second process parameter P2, particularly during operation of the apparatus 1, and to generate at least one second data set DS2 comprising the second process parameter P2 or information relating to the detected second process P2 parameter, respectively.

The process parameter P2 may be or refer to at least one chemical parameter, e.g. chemical composition, chemical behavior, etc., and/or geometrical parameter, e.g. dimensions, shape, etc., and/or physical parameter, e.g. temperature, radiation emission, etc., of at least one consolidation zone 17, particularly a melting zone in which build material 3 is heated above its melting point by means of irradiation and consolidated by subsequent cooling below its melting point, in which the selective irradiation and consolidation of layers of build material takes place during operation of the apparatus 1. Hence, the second process parameter P2 may (directly) refer to a consolidation zone 17 in which an irradiation and consolidation of build material takes place during operation of the apparatus 1.

The second detection device 16 may be or comprise at least one detection element adapted to detect at least one chemical parameter and/or geometrical parameter and/or physical parameter of the consolidation zone 17, particularly melting zone in which build material 3 is heated above its melting point and consolidated by subsequent cooling below its melting point. A respective detection element may be an optical or thermal detector, in particular an optical or thermal sensor, e.g. a camera and/or a photodiode.

The apparatus 1 further comprises a hard- and/or software embodied data processing device 18, e.g. a computing device, adapted to link the first data set DS1 with a second data set DS2 so as to allow for a determination of correlations, in particular dependencies, between a detected first process parameter P1 and a detected second process parameter P2. The data processing device 18 is adapted for a special data processing which allows for a linkage of respective data sets DS1, DS2 generated by the different detection devices 15, 16 of the apparatus 1. Hence, a first process parameter P1 or a plurality of first process parameters P1 contained in a first data set DS1 can be linked with a second process parameter P2 or a plurality of second process parameters P2 contained in a second data set DS2.

The data linkage of respective data sets DS1, DS2 creates the possibility of determining discovering, recognizing or observing correlations, in particular dependencies, between different process parameters P1, P2 and therefore, a special way of analyzing and evaluating, respectively respective process parameters P1, P2 and data sets DS1, DS2 generated by different detection devices 15, 16 of the apparatus 1. This allows for a determination, discovery, recognition and observation of correlations, between detected first process parameters P1 and detected second process parameters P2. As such, a possible or real influence of a first process parameter P1 on a second process parameter P2 and a possible or real influence of a change of a first process parameter P1 on a possible or real change of a second process parameter P2 may be determined.

Knowledge or insights on respective correlations or dependencies, respectively of process parameters P1, P2 allows for an improved monitoring of the additive build process, in particular the process quality, during operation of the apparatus 1. Hence, the data linkage of respective data sets DS1, DS2 allows for a more comprehensive monitoring of the additive build process, in particular the process quality, during operation of the apparatus 1. A more comprehensive monitoring and understanding of the additive build process allows for an improved adjustment of process parameters resulting in improved process and part quality.

The apparatus 1 comprises a hard- and/or software embodied data analyzation and/or evaluation device 19 adapted to analyze and/or evaluate the linked first and second data sets DS1, DS2 so as to determine correlations, in particular dependencies, between detected first and second process parameters P1, P2. The evaluation device 19 may comprise a number of data analyzation and/or evaluation algorithms adapted to analyze and/or evaluate respective linked data sets DS1, DS2 so as to determine, discover, recognize or observe correlations, in particular dependencies, between detected first and second process parameters P1, P2.

The apparatus 1 further comprises a (central) process control device 20 adapted to control at least one process parameter on basis of a determined correlation, in particular dependency, between a detected first and second process parameter P1, P2. Hence, determined correlations or dependencies of process parameters P1, P2 may be readily used for controlling process parameters and the entire build process so as to allow for improvements of process and object quality. In particular, determined correlations may be used in real-time for controlling process parameters and the entire build process so as to allow for real-time improvements of process and object quality during operation of the apparatus 1.

The apparatus 1 may further comprise an information output device 21 adapted to output a, particularly audio and/or video, information relating to a determined correlation, in particular dependency, between a detected first and second process parameter P1, P2. Hence, determined correlations or dependencies of detected first and second process parameter P1, P2 may be output to a user. The term output refers both to an audio and/or video output of respective information at a respective output interface, e.g. display, loudspeaker, etc., provided with the apparatus 1, and a data transmission of respective information via a wired or wireless, if need be encoded, data transmission to a data network and/or at least one (mobile) device of a user.

The information output device 21 may be adapted to output a, particularly audio and/or video, warning information relating to a determined correlation or dependency between a detected first and second process parameter P1, P2 which correlation or dependency may negatively affect the process quality and/or object quality. Hence, a user may be instantly informed about possible correlations of process parameters P1, P2 which might compromise process quality and/or object quality.

The apparatus may further comprise a data storage device 22, e.g. a hard-drive, adapted to store determined correlations or dependencies of detected first and second process parameters P1, P2. Thus, determined correlations or dependencies of detected first and second process parameters P1, P2 can be stored and used for process monitoring in future additive manufacturing processes. The data storage device 22 may be accessible by different apparatuses, e.g. in an additive manufacturing plant in which a plurality of apparatuses is installed.

A possible method for operating the apparatus 1 may comprise the steps of:
  detecting at least one first process parameter P1, particularly during operation of the apparatus 1, and generating a first data set DS1 comprising information relating to the detected first process parameter P1;
  detecting at least one second process parameter P2, particularly during operation of the apparatus 1, and generating at least one second data set DS2 comprising information relating to the detected second process parameter P2;
  linking the first data set DS1 with the second data set DS2 so as to determine correlations, in particular dependencies, between the detected first process and second process parameter P1, P2.

The method may be implemented as selective laser melting process or a selective electron beam melting process, for instance.

The invention claimed is:

1. An apparatus for additively manufacturing three-dimensional objects, the apparatus comprising:
  a first detection device configured to detect a first process parameter during operation of the apparatus, and to generate a first data set comprising information relating to the first process parameter;
  a second detection device configured to detect a second process parameter during operation of the apparatus, and to generate a second data set comprising information relating to the second process parameter; and
  a data processing device configured to determine a mutual dependency between the first process parameter and the second process parameter, the mutual dependency based at least in part on the first data set and the second data set;
  wherein the mutual dependency comprises a possible influence or a real influence of the first process parameter on the second process parameter;
  wherein the first process parameter comprises a chemical parameter and/or a physical parameter of an atmosphere within a process chamber of the apparatus; and
  wherein the second process parameter comprises a chemical parameter, a geometrical parameter, and/or a physical parameter of a melting zone in which build material is heated above its melting point and consolidated by subsequent cooling below its melting point, in a build plane in which the selective irradiation and consolidation of layers of build material takes place during operation of the apparatus.

2. The apparatus of claim 1, wherein the first process parameter comprises a chemical parameter and/or a physical parameter of: a functional device of the apparatus, a gaseous fluid stream streaming through the process chamber of the apparatus, non-consolidated or consolidated portions of a build material layer, or an energy beam for selectively irradiating a build material layer.

3. The apparatus of claim 1, wherein the first detection device comprises:
  a sensor element configured to detect the first process parameter.

4. The apparatus of claim 1, wherein the second detection device comprises:
  a sensor element configured to detect the second process parameter.

5. The apparatus of claim 1, comprising:
a process control device configured to control the first process parameter and/or the second process parameter based at least in part on the mutual dependency.

6. The apparatus of claim 1, comprising:
an information output device configured to output audio information and/or video information, the audio information and/or the video information relating to the mutual dependency.

7. The apparatus of claim 6, wherein the audio information comprises an audio warning and/or the video information comprises a video warning.

8. The apparatus of claim 1, comprising:
a data storage device configured to store the mutual dependency of the first process parameter and the second process parameter.

9. The apparatus of claim 1, wherein the possible influence or the real influence of the first process parameter on the second process parameter comprises a possible influence or a real influence of a change to the first process parameter on the second process parameter.

10. A method of additively manufacturing a three-dimensional object, the method comprising:
detecting, with a first detection device, a first process parameter during operation of the apparatus, and generating a first data set comprising information relating to the first process parameter;
detecting, with a second detection device, a second process parameter during operation of the apparatus, and generating a second data set comprising information relating to the second process parameter; and
determining, with a data processing device, a mutual dependency between the first process parameter and the second process parameter, the mutual dependency based at least in part on the first data set and the second data set;
wherein the mutual dependency comprises a possible or real influence of the first process parameter on the second process parameter;
wherein the first process parameter comprises a chemical parameter and/or a physical parameter of an atmosphere within a process chamber of the apparatus; and
wherein the second process parameter comprises a chemical parameter, a geometrical parameter, and/or a physical parameter of a melting zone in which build material is heated above its melting point and consolidated by subsequent cooling below its melting point, in a build plane in which the selective irradiation and consolidation of layers of build material takes place during operation of the apparatus.

11. The method of claim 10, wherein the first process parameter comprises a chemical parameter and/or a physical parameter of: a functional device of the apparatus, a gaseous fluid stream streaming through the process chamber of the apparatus, non-consolidated or consolidated portions of a build material layer, or an energy beam for selectively irradiating a build material layer.

12. The method of claim 10, wherein the first detection device comprises:
a sensor element configured to detect the first process parameter.

13. The method of claim 10, wherein the second detection device comprises:
a sensor element configured to detect the second process parameter.

14. The method of claim 10, comprising:
controlling, with a process control device, the first process parameter and/or the second process parameter based at least in part on the mutual dependency.

15. The method of claim 10, comprising:
outputting, with an information output device, audio information and/or video information, the audio information and/or the video information relating to the mutual dependency.

16. The method of claim 15, wherein the audio information comprises an audio warning and/or the video information comprises a video warning.

17. The method of claim 10, comprising:
storing, with a data storage device, the mutual dependency of the first process parameter and the second process parameter.

18. The method of claim 10, wherein the possible influence or the real influence of the first process parameter on the second process parameter comprises a possible influence or a real influence of a change to the first process parameter on the second process parameter.

* * * * *